US012749522B2

(12) United States Patent
Okuno

(10) Patent No.: US 12,749,522 B2
(45) Date of Patent: Sep. 29, 2026

(54) SEMICONDUCTOR MEMORY DEVICE AND METHOD FOR CONTROLLING THE SAME FOR ROW-HAMMER REFRESH OPERATIONS WITHOUT REDUCING THE PERFORMANCE OF NORMAL REFRESH OPERATIONS

(71) Applicant: Winbond Electronics Corp., Taichung City (TW)

(72) Inventor: Shinya Okuno, Yokohama (JP)

(73) Assignee: WINBOND ELECTRONICS CORP., Taichung City (TW)

( * ) Notice: Subject to any disclaimer, the term of this patent is extended or adjusted under 35 U.S.C. 154(b) by 136 days.

(21) Appl. No.: 18/788,361

(22) Filed: Jul. 30, 2024

(65) Prior Publication Data

US 2025/0285673 A1 Sep. 11, 2025

(30) Foreign Application Priority Data

Mar. 6, 2024 (JP) ................................ 2024-033669

(51) Int. Cl.

| | |
|---|---|
| ***G11C 7/00*** | (2006.01) |
| ***G11C 11/406*** | (2006.01) |
| ***G11C 11/408*** | (2006.01) |

(52) U.S. Cl.

CPC .. *G11C 11/40622* (2013.01); *G11C 11/40615* (2013.01); *G11C 11/4087* (2013.01)

(58) Field of Classification Search

CPC ........ G11C 11/40622; G11C 11/40615; G11C 11/4087; G11C 11/40611; G11C 8/10; G11C 11/4076

USPC .......................................................... 365/222

See application file for complete search history.

(56) References Cited

U.S. PATENT DOCUMENTS

| | | | | |
|---|---|---|---|---|
| 9,741,421 | B1 | 8/2017 | Hedden | |
| 11,031,066 | B2 * | 6/2021 | He | G11C 11/40622 |
| 11,043,254 | B2 * | 6/2021 | Enomoto | G11C 11/408 |
| 2019/0130959 | A1 | 5/2019 | Moon et al. | |
| 2020/0090729 | A1 | 3/2020 | Son et al. | |
| 2022/0157373 | A1 | 5/2022 | Choi et al. | |

FOREIGN PATENT DOCUMENTS

| | | | |
|---|---|---|---|
| CN | 107924697 | A | 4/2018 |
| CN | 117437947 | A | 1/2024 |
| KR | 10-2019-0048049 | A | 5/2019 |
| KR | 10-2022-0068532 | A | 5/2022 |
| TW | 201535366 | A | 9/2015 |

OTHER PUBLICATIONS

Korean Office Action for Korean Application No. 10-2024-0132117, dated Aug. 27, 2025, with English translation.

* cited by examiner

*Primary Examiner* — Tha-O H Bui

(74) *Attorney, Agent, or Firm* — Birch, Stewart, Kolasch & Birch, LLP

(57) ABSTRACT

Provided are a semiconductor memory device and method for controlling the same, to carry out row-hammer refresh operations without degrading the performance of the normal refresh operation. The semiconductor device includes a control section 10 configured to simultaneously refresh each memory cell connected to a plurality of word lines in response to a refresh request, and performing a row-hammer refresh operation after executing at least one normal refresh operation.

12 Claims, 4 Drawing Sheets

SEMICONDUCTOR MEMORY DEVICE AND METHOD FOR CONTROLLING THE SAME FOR ROW-HAMMER REFRESH OPERATIONS WITHOUT REDUCING THE PERFORMANCE OF NORMAL REFRESH OPERATIONS

CROSS REFERENCE TO RELATED APPLICATIONS

This Application claims priority of Japanese Patent Application No. 2024-033669, filed on Mar. 6, 2024, the entirety of which is incorporated by reference herein.

BACKGROUND OF THE INVENTION

Field of the Invention

The present invention relates to a semiconductor memory device and a method for controlling the same.

Description of the Related Art

A Dynamic Random Access Memory (DRAM) is a volatile memory that stores charge through a capacitor to store information. When no power is supplied to the DRAM, the stored information is not retained. The charge stored in the capacitor may discharge after a certain period, so the DRAM requires a memory retention operation called refresh, which is a regular charging of the capacitor.

In the way, during the execution of a refresh, when a plurality of read and/or write requests for the same row address are concentrated together, Row Hammer (RH) may occur and cause a data corruption problem. Therefore, to solve the row hammer problem, existing semiconductor memory devices are equipped with a row-hammer refresh function to detect frequently accessed row addresses (hammer addresses), and additional refresh operations are performed to the row addresses that are physically adjacent to the detected hammer addresses.

BRIEF SUMMARY OF THE INVENTION

As illustrated in FIG. 1A, a row-hammer refresh operation RH_ref is performed in a conventional semiconductor memory device after a normal refresh operation Reg_ref performed in response to a refresh request (refresh command) REF. In this example, two normal refresh operations Reg_ref are performed on the row address corresponding to any word line WL in response to a refresh request REF. Thereafter, a row-hammer refresh RH_ref is performed on every row address (that is, the detected hammer address ±1) that is physically adjacent to the detected hammer address. However, in such cases, the period during which the normal refresh operation Reg_ref and the row-hammer refresh operation RH_ref are completed in response to a refresh request REF may exceed the refresh cycle time tRFC. The refresh cycle time tRFC is determined by the product specifications, and a period during which it is allowable to complete a normal refresh operation Reg_ref in response to a refresh request REF.

In addition, in the specifications of traditional semiconductor memory devices, the refresh cycle time tRFC is set to be shorter as the memory capacity becomes smaller. In such cases, as shown in FIG. 1B, the refresh cycle time tRFC of one refresh request REF is only sufficient to perform one normal refresh operation Reg_ref, making it difficult to perform an additional row-hammer refresh operation RH_ref during the refresh cycle time tRFC.

In addition, as shown in FIG. 1C, the normal refresh operation Reg_ref performed in response to one refresh request REF can be replaced by the row-hammer refresh operation RH_ref. However, in such cases, the interval to execute the normal refresh operation Reg_ref again on the same row address (FIG. 1C, illustrated as "A") may exceed the refresh cycle tREF because the period required to perform the row-hammer refresh operation is added to the period after the normal refresh operation Reg_ref for all row addresses is completed. The refresh cycle tREF is the interval during which a normal refresh operation needs to be performed on the same row address again, depending on the product specifications.

Therefore, in conventional semiconductor memory devices, it is difficult to perform a row-hammer refresh operation without degrading the performance of a normal refresh operation such as the refresh cycle time tRFC or the refresh cycle tREF.

To solve the above problems, the present invention provides a semiconductor memory device. The semiconductor memory device includes a control section that controls the normal refresh operation in response to a refresh request. The normal refresh operation simultaneously refreshes the corresponding memory cells connected to a plurality of word lines. When the normal refresh operation has been performed at least once, the control section controls the row hammer refresh operation.

The present invention performs normal refresh operations on a plurality of word lines (row addresses) simultaneously in response to one refresh request. Therefore, compared to cases where the normal refresh operation is only performed on a single word line in response to one refresh request, the number of refresh requests required to perform normal refresh operations on all word lines can be reduced. This also reduces the time required to perform normal refresh operations on all word lines. At this moment, since the row-hammer refresh operation can be performed in response to the reduced number of refresh requests, it is possible to perform normal refresh operations on all row addresses and at least one row-hammer refresh operation within the refresh cycle time tRFC. Therefore, the row-hammer refresh operation can be performed without degrading the performance of normal refresh operations.

In addition, the present invention provides a control method for a semiconductor memory device. The method includes the following step: in response to a refresh request, a control section of the semiconductor memory device controls a normal refresh operation, and the normal refresh operation simultaneously refreshes the corresponding memory cells connected to a plurality of word lines. Furthermore, the control section of the semiconductor memory device controls the row-hammer refresh operation after the normal refresh operation has been performed at least once.

Using the semiconductor memory device of the present invention and the method for controlling the same, row-hammer refresh operations can be performed without reducing the performance of normal refresh operations.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
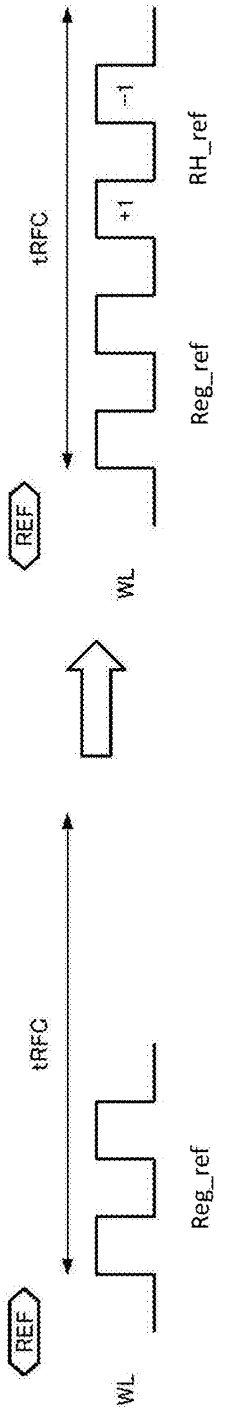
FIGS. 1A to 1C are examples showing the signal voltage changes when normal refresh operations and row-hammer refresh operation are performed in a conventional semiconductor memory device.
Figure 1B:
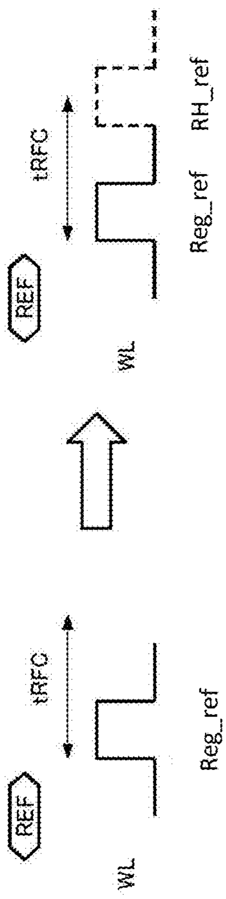
Figure 1C:
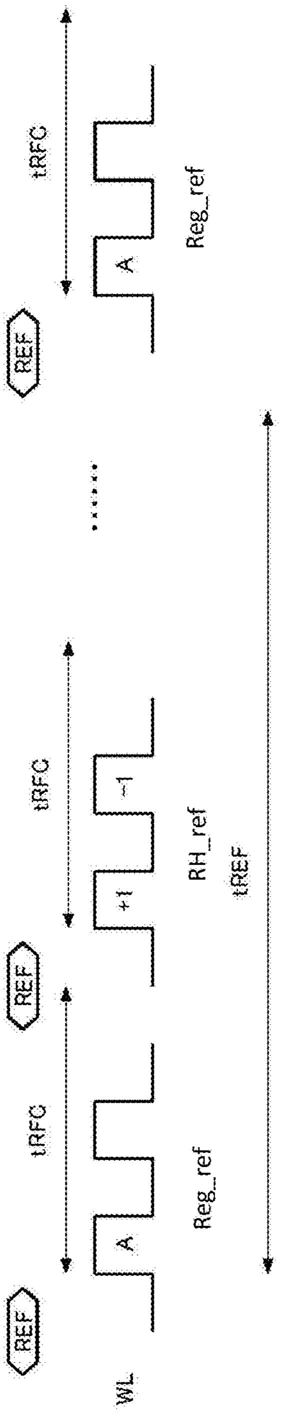
Figure 2:
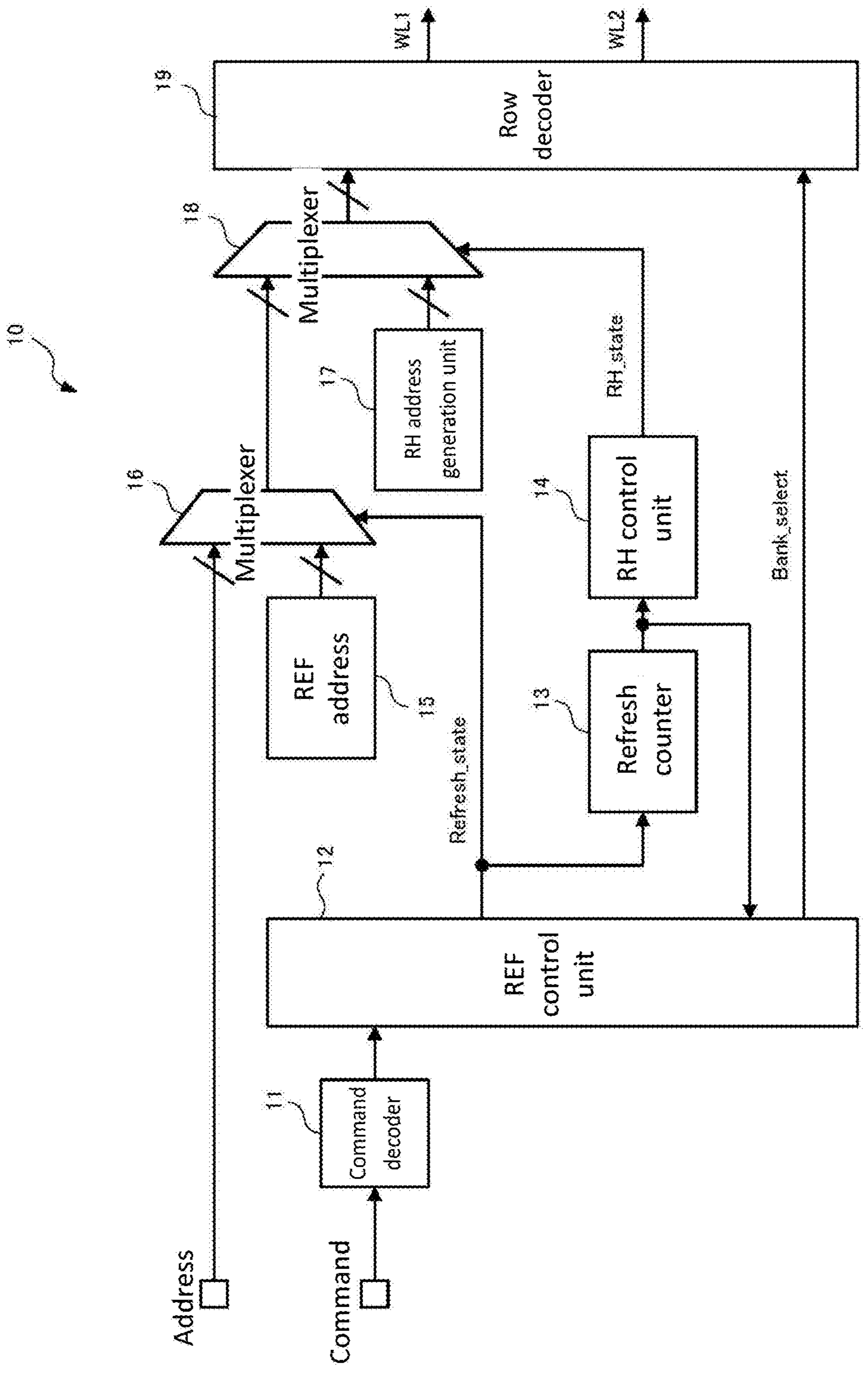
FIG. 2 shows a configuration example of a semiconductor memory device according to one embodiment of the present invention.

FIG. 2 shows a configuration example of a semiconductor memory device according to one embodiment of the present invention. The semiconductor memory device, for example, may be a DRAM, or a pSRAM (pseudo-Static Random) configured to control refresh operation internally.

Referring to FIG. 2, the semiconductor memory device of this embodiment includes a control section 10. The control section 10 includes a command decoder 11, a refresh (REF) control unit 12, a refresh counter 13, a row-hammer (RH) control unit 14, a refresh (REF) address counter 15, a multiplexer 16, a row-hammer (RH) address generation unit 17, a multiplexer 18, and a row decoder 19. Each of the parts 11~19 in the control section 10, can be constructed through dedicated hardware devices or logic circuits. In addition, for convenience of explanation, other conventional circuits such as memory cell arrays, power circuits, clock generators, etc. are not shown in this embodiment.

In this embodiment, in response to the refresh request REF, the control section 10 controls to perform the normal refresh operation Reg_ref simultaneously on the memory cells (illustration omitted) connected to a plurality of word lines, two word lines WL1 and WL2 in this embodiment. Furthermore, the control section 10 controls to perform the additional row-hammer refresh operation RH_ref on the detected hammer address after it has performed the normal refresh operation Reg_ref at least once. Where, in one row-hammer refresh operation RH_ref, a refresh operation is performed on the row address that is physically adjacent to the detected hammer address (that is, the row address of the hammer address ±1).

In addition, the control section 10 may be configured to perform the row-hammer refresh operation RH_ref in response to the refresh request REF. Therefore, the row-hammer refresh operation RH_ref can be performed in response to the refresh request REF.

In addition, the control section 10 may be configured to perform a plurality of normal refresh operations Reg_ref in response to the refresh request REF, during the refresh cycle time tRFC (the predetermined period). Therefore, the refresh rate of normal refresh operation Reg_ref is improved.

In addition, the control section 10 may be configured to perform a plurality of row-hammer refresh operation RH_ref in response to the refresh request REF, during the refresh cycle time tRFC (the predetermined period). Therefore, the refresh rate of row-hammer refresh operation RH_ref is improved.

In addition, the control section 10 may be configured to determine which refresh operation is to be performed, either the normal refresh operation Reg_ref or the row-hammer refresh operation RH_ref, each time the refresh request REF is acquired. Therefore, in response to the refresh request REF, either the normal refresh operation Reg_ref or the row-hammer refresh operation RH_ref can be performed.

In addition, the control section 10 may be configured not to perform the normal refresh operation Reg_ref when the refresh request REF is received after the number of executions of the normal refresh operation Reg_ref reaches a predetermined value. Therefore, for example, when the number of executions of the normal refresh operation Reg_ref reaches the predetermined value, or when the number of executions of each normal refresh operation Reg_ref reaches the predetermined value, the row-hammer refresh operation RH_ref can be performed to replace the normal refresh operation Reg_ref.

In addition, the control section 10 may be configured not to perform the normal refresh operation Reg_ref when the refresh request REF is received after the normal refresh operation Reg_ref is continuously performed a predetermined number of times. Therefore, for example, when the normal refresh operation Reg_ref is continuously performed the predetermined number of times (for example, two times), the row-hammer refresh operation RH_ref may be performed to replace the normal refresh operation Reg_ref.

Below, the explicit configuration of each part 11~19 in the control section 10 will be described in detail with reference to FIG. 2.

Referring to FIG. 2, the command decoder 11 decodes command signals input from outside, and generates internal commands. The internal commands, for example, include refresh request REF, active command, read command, write command, and pre-charge command, etc. When the command decoder 11 generates (acquires) the refresh request REF based on the command signals input from outside, the command decoder 11 outputs the refresh request REF to the REF control unit 12. In addition, when the semiconductor memory device is a SRAM, the command decoder 11 may generate (acquire) the refresh request REF every predetermined period, and outputs the refresh request REF to the REF control unit 12.

When the refresh request REF is input to the REF control unit 12, the REF control unit 12 validates the signal Refresh_state indicating the refresh state (makes Refresh_state at high level), from the time when the refresh request REF is input until a predetermined period (for example, the refresh cycle time tRFC) elapses. The REF control unit 12 outputs the signal Refresh_state to the refresh counter 13 and the multiplexer 16. In addition, the refresh count value counted by the refresh counter 13 is input to the REF control unit 12. Here, the REF control unit 12, in response to the refresh count value, makes the signal Bank_select valid (high level) or invalid (low level), and outputs the signal Bank_select to the row decoder 19. The signal Bank_select is used for selecting the memory bank to be subjected to the normal refresh operation Reg_ref or the row-hammer refresh operation RH_ref.

The refresh counter 13 is configured to count the number of times a normal refresh operation Reg_ref is performed in response to the refresh request REF. In specific, each time the signal Refresh_state changes from valid to invalid, the refresh counter 13 increases the refresh count value by 1. Furthermore, the refresh counter 13 outputs a signal indicating the refresh count value to the REF control unit 12 and the RH control unit 14. In one embodiment, the refresh count value may be set to cycle within a predetermined range (for example, 0~3). In addition, the refresh counter 13 is an example of the "counter" according to the present invention.

When the refresh count value from the refresh counter 13 is input, the RH control unit 14 outputs the signal RH_state indicating the row-hammer state to the multiplexer 18. In this embodiment, when the refresh count value reaches a predetermined value (for example, 3), the RH control unit 14 validates the signal RH_state and outputs it to the multiplexer 18.

The REF address counter 15 is configured to count the row address that becomes the target of the normal refresh operation Reg_ref. For example, when each normal refresh operation Reg_ref is completed, the REF address counter 15 increases the value of the target row address of the normal refresh operation Reg_ref by a predetermined value (for example, 1), and outputs this value to the multiplexer 16 as the target row address for the next normal refresh operation Reg_ref. Furthermore, the REF address counter 15 may have same and well known configuration.

The multiplexer 16 is configured to, based on the signal Refresh_state, select the first row address included in the address signal input from the outside or the second row address (that is, the target row address of the normal refresh operation Reg_ref) input from the REF address counter 15, and output the selected row address to the multiplexer 18. In specific, when the multiplexer 16 is input with a valid signal Refresh_state (that is, when the normal refresh operation Reg_ref is performed), the multiplexer 16 selects and outputs the second row address to the multiplexer 18. On the other hand, when the multiplexer 16 is input with an invalid signal Refresh_state (that is, when the normal refresh operation Reg_ref is not performed), the multiplexer 16 selects and outputs the first row address to the multiplexer 18. Here, the multiplexer 16 is an example of the "first selection unit" of the present invention.

The RH address generation unit 17 is configured such that when a frequently accessed row address (hammer address) is detected, it outputs the row address becoming the target of the row-hammer refresh operation RH_ref (for example, the row address of hammer address ±1) to the multiplexer 18. In addition, the detection method for the hammer address can be the same as the well-known method.

The multiplexer 18 is configured to select the row address input from the multiplexer 16, or the third row address (that is, the target row address of the row-hammer refresh operation RH_ref) input from the RH address generation unit 17, based on the signal RH_state, and outputs the selected row address to the row decoder 19. Specifically, when the multiplexer 18 is input with a valid signal RH_state (that is, when the hammer refresh operation RH ref is performed), a third column address is selected and output to the column decoder 19. On the other hand, when the multiplexer 18 is input with an invalid signal RH_state (that is, when the column hammer refresh operation RH ref is not performed), the row address input from the multiplexer 16 is selected and output to the row decoder 19. Here, the multiplexer 18 is an example of the "second selection unit" of the present invention.

The row decoder 19 is configured to select a plurality of word lines (here, two word lines WL1 and WL2) becoming the target of the normal refresh operation Reg_ref when the normal refresh operation Reg_ref is executed (for example, the signal Refresh_state is valid, and the signal RH_state is invalid) and the second row address is input from the multiplexer 18 (that is, when the row address selected through the multiplexer 18 is the second row address). In one embodiment, the row decoder 19, for example, may store information (for example, table information) indicating a correspondence between the second row address and word lines WL1 and WL2. In addition, although not shown in FIG. 2, the row decoder 19 may be configured to be input with the signal Refresh_state and the signal RH_state.

In addition, the row decoder 19 is configured to select the word line corresponding to the first row address when the first row address is input from the multiplexer 18. Furthermore, the row decoder 19 is configured to select the word line corresponding to the target row address of the row-hammer refresh operation RH_ref when the third row address is input from the multiplexer 18.

Figure 3A:
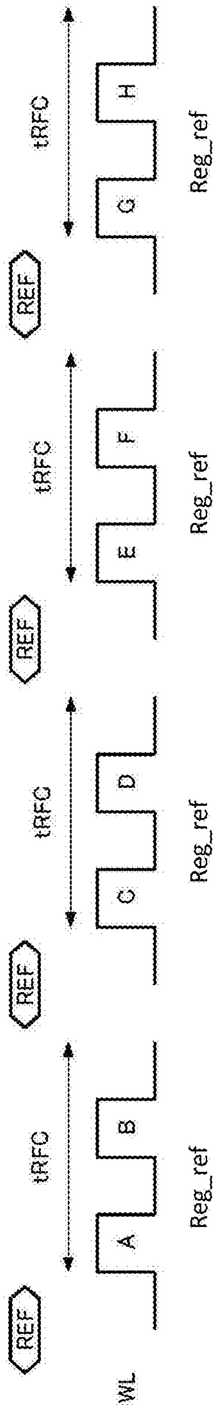
FIG. 3A is an example showing change of signal voltage when a normal refresh operation is performed in a conventional semiconductor memory device.
Figure 3B:
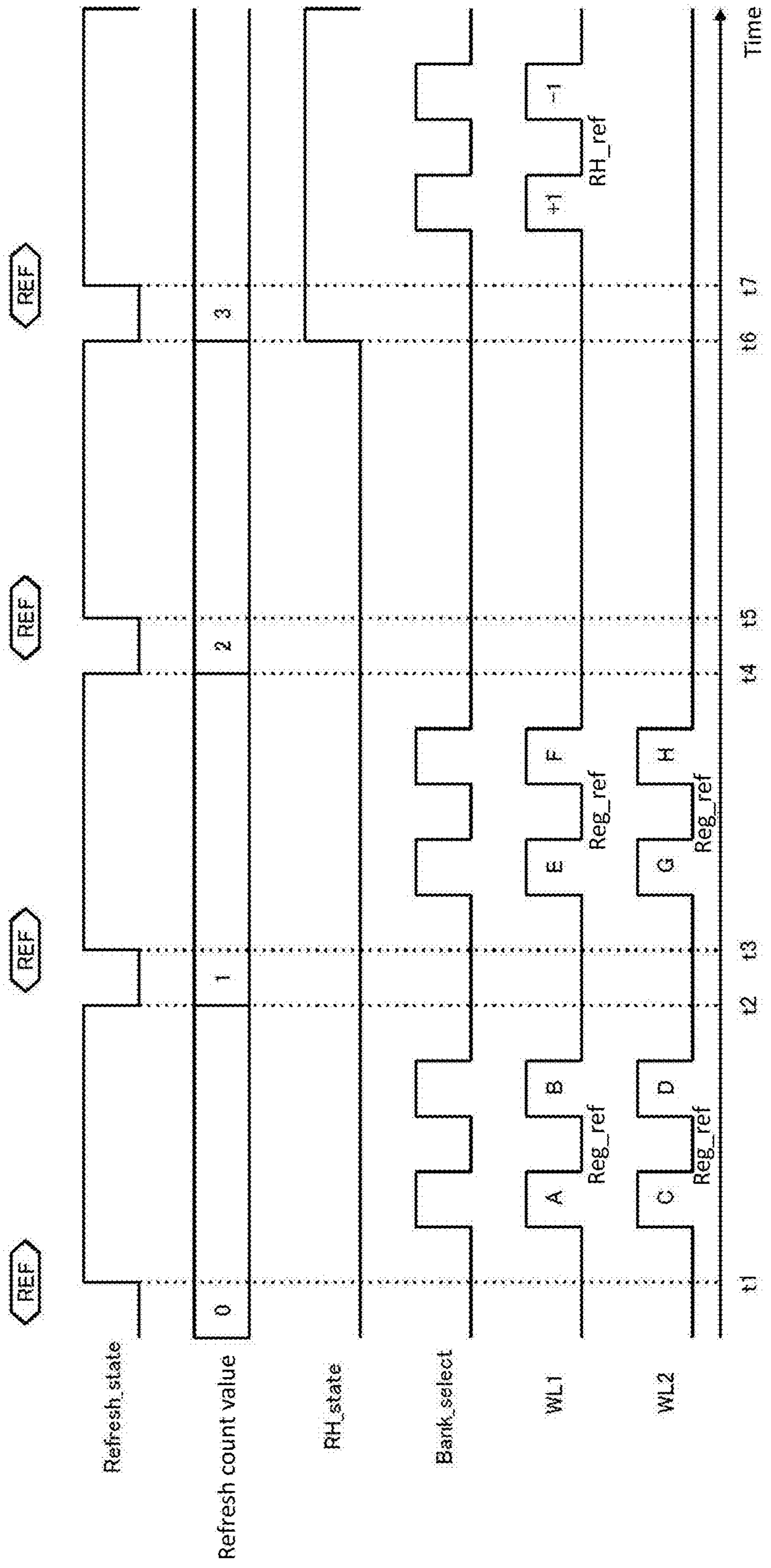
FIG. 3B is an example showing change of each signal voltage when a normal refresh operation and a row-hammer refresh operations are performed in a semiconductor memory device according to one embodiment of the present invention.

FIGS. 3A and 3B illustrate the example of the operation when the control section 10 performs the normal refresh operation Reg_ref and the row-hammer refresh operation RH_ref. FIG. 3A shows an example of the change in the voltage of the word line WL when two normal refresh operations Reg_ref are performed for each of four refresh requests REF in a conventional semiconductor memory device (that is, when the normal refresh operation Reg_ref is performed on a total of eight row-addresses A~H through four refresh requests REF). FIG. 3B shows an example of the voltage changes of each signal when the normal refresh operation Reg_ref and the row-hammer refresh operation RH_ref are performed in this embodiment.

First, at time t1, when the refresh request REF generated (acquired) by the command decoder 11 is input to the REF control unit 12, the REF control unit 12 validates the signal Refresh_state and outputs it to the refresh counter 13 and the multiplexer 16. At the same time, the REF control unit 12 determines that the refresh count value 0 input from the refresh counter 13 is a value other than the first predetermined value (2 in this example), and outputs two pulse signals Bank_select to the row decoder 19. The two pulse signals Bank_select are used for selecting the memory bank to be executed by the normal refresh operation Reg_ref.

Here, the second row address output from the REF address counter 15 is input to the row decoder 19 through the multiplexer 16 and the multiplexer 18. When a first high-level signal Bank_select is input, the row decoder 19 selects a plurality of word lines (in this example, two word lines WL1 and WL2) corresponding to the input second row address. In the example of FIG. 3B, the row decoder 19 selects the word line WL1 corresponding to the row address A, and the word line WL2 corresponding to the row address C when the first high-level signal Bank_select is input. In addition, the control section 10 performs the normal refresh operation Reg_ref on the row address A and the row address C simultaneously.

In addition, when a second high-level signal Bank_select is input, the row decoder 19 selects a plurality of word lines (in this example, two word lines WL1 and WL2) corresponding to the newly input second row address. In the example of FIG. 3B, the row decoder 19 selects the word line WL1 corresponding to the row address B, and the word line WL2 corresponding to the row address D when the second high-level signal Bank_select is input. In addition, the control section 10 performs the normal refresh operation Reg_ref on the row address B and the row address D simultaneously.

Next, at time t2, when the signal Refresh_state changes from valid to invalid, the refresh counter 13 increases the refresh count value by 1. In addition, at time t3, when the refresh request REF is input to the REF control unit 12, the control section 10 performs a plurality of normal refresh operations (in this example, performing the normal refresh operation two times) on the row addresses corresponding to the selected plurality of word lines WL1 and WL2, in the same manner as the executions at time t1. Thereby, the normal refresh operation Reg_ref is performed on the row addresses E, F, G, and H between time t3 and time t4.

As mentioned above, the control section 10, through responding to one refresh request REF, outputs a plurality of pulse signals Bank_select (in this example, two pulse signals Bank_select) for selecting the memory bank to be executed with the normal refresh operation Reg_ref. Therefore, the normal refresh operation Reg_ref can be performed multiple times (two times in this example) within the refresh cycle time tRFC (the predetermined period).

In addition, the control section 10 responds to one refresh request REF and selects a plurality of word lines (two word lines in this example) to perform the normal refresh operation Reg_ref simultaneously, and therefore normal refresh operations Reg_ref can be performed multiple times (two times in this example) within the same refresh cycle time tRFC (the predetermined period).

In this manner, in this embodiment, the normal refresh operation Reg_ref can be performed on a total of eight row-addresses A~H through two refresh requests REF.

Then, at time t4, when the signal Refresh_state changes from valid to invalid, the refresh counter 13 increases the refresh count value by 1. In addition, at time t5, when the refresh request REF is input to the REF control unit 12, the REF control unit 12 validates the signal Refresh_state and outputs it to the refresh counter 13 and the multiplexer 16. Furthermore, when the REF control unit 12 determines that the refresh count value input from the refresh counter 13 is the first predetermined value, 2 in this example, (that is, determines that the normal refresh operation Reg_ref has been performed on the eight row-addresses A~H), the REF control unit 12 may not output the Bank_select signal to the row decoder 19 (that is, the normal refresh operation Reg_ref will not be performed).

By this manner, after determining that the normal refresh operation Reg_ref has been executed a predetermined number of times (four times in this example), the control section 10 can determine not to execute a normal refresh operation Reg_ref the next time a refresh request REF is received. In this example, since two normal refresh operations Reg_ref are performed for each refresh request REF, when the refresh count value is a predetermined value (2 in this example), it can be ascertained that the normal refresh operations Reg_ref have been performed four times.

In addition, in one embodiment, the control section 10 may determine not to execute a normal refresh operation Reg_ref the next time a normal refresh operation Reg_ref has been executed a predetermined number of times (for example, 4 times) after the refresh request REF was received.

Next, at time t6, when the signal Refresh_state changes from valid to invalid, the refresh counter 13 increases the refresh count value by 1. At the same time, when the RH control unit 14 determines that the refresh count value input from the refresh counter 13 has reached the second predetermined value (here is 3), the RH control unit 14 enables the signal RH_state and outputs it to the multiplexer 18.

In addition, at time t7, when the refresh request REF generated (acquired) by the command decoder 11 is input to the REF control unit 12, the REF control unit 12 validates the signal Refresh_state and outputs it to the refresh counter 13 and the multiplexer 16. At the same time, when the REF control unit 12 determines that the refresh count value (here is 3) input from the refresh counter 13 is a value other than the first predetermined value (2 in this example), the REF control unit 12 outputs two pulse signals Bank_select for selecting and executing the row-hammer refresh operation RH_ref, to the row decoder 19.

At the same time, the third row address output from the RH address generation unit 17 is input to the row decoder 19 through the multiplexer 18; wherein the third row address is the target row address of the row-hammer refresh operation RH_ref. When the first high-level signal Bank_select is input, the row decoder 19 selects the word line WL1 corresponding to the input third row address (here, the row address of the hammer address plus 1). Further, the control section 10 performs the row-hammer refresh operation RH_ref on the row address of the hammer address plus 1. In addition, when the second high-level signal Bank_select is input, the row decoder 19 selects the word line WL1 corresponding to the input third row address (here, the row address of hammer address minus 1). Furthermore, the control section 10 performs the row-hammer refresh operation RH_ref on the column address of hammer address minus 1.

In this manner, the control section 10 can respond to the refresh request REF to control the execution of the row-hammer refresh operation RH_ref.

In addition, in this embodiment, whenever the control section 10 acquires the refresh request REF, the control section 10 can determine whether to perform the normal refresh operation Reg_ref or the row-hammer refresh operation RH_ref, based on the operations of the REF control unit 12, the refresh counter 13 and the RH control unit 14.

Furthermore, in the example of FIG. 3B, although the case that one row-hammer refresh operation RH_ref is performed within the refresh cycle time tRFC is used as an example for illustration, the row-hammer refresh operation RH_ref can also be performed more than 2 times within the refresh cycle time tRFC.

Thereby, for four refresh requests REF, normal refresh operations Reg_ref for eight row-addresses A~H and one row-hammer refresh operation RH_ref can be performed within the refresh cycle time tRFC.

As described above, according to the semiconductor memory device and the method for controlling the same of this embodiment, the normal refresh operation Reg_ref can be simultaneously performed on the plurality of word lines (row addresses) WL1 and WL2 in response to one refresh request REF. Therefore, for example, compared with the situation where only one normal refresh operation Reg_ref is performed on one word line in response to one refresh request REF, the number of refresh requests REF required to perform the normal refresh operation Reg_ref on all word lines can be reduced. Therefore, since the present invention can perform the row-hammer refresh operation RH_ref in response to the reduced amount of refresh requests REF, it can ensure that the normal refresh operation Reg_ref for all row addresses, and at least one row-hammer refresh operation RH_ref are performed within the refresh cycle tREF. Therefore, it is possible to perform the row-hammer refresh operation RH_ref without degrading the performance of the normal refresh operation Reg_ref.

Figure 4A:
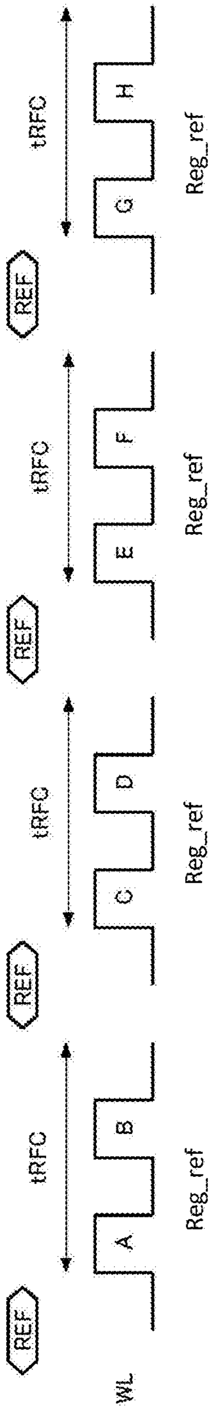
FIG. 4A is an example showing change of signal voltage when a normal refresh operation is performed in a conventional semiconductor memory device.
Figure 4B:
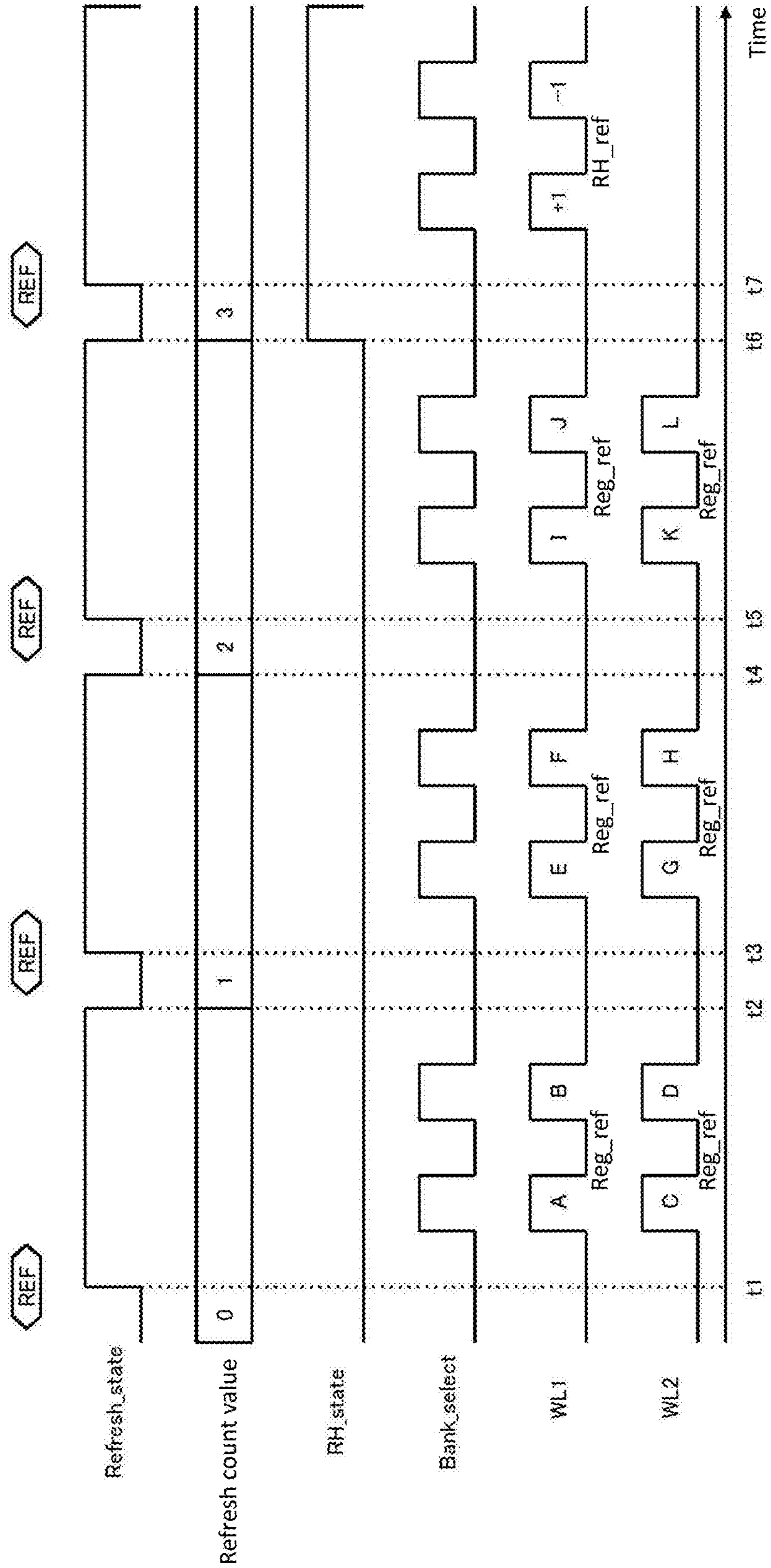
FIG. 4B is an example showing change of each signal voltage when a normal refresh operation and a row-hammer refresh operation are performed in a semiconductor memory device according to a variation of the present invention.

In the above embodiment, although the case that the normal refresh operation Reg_ref is not performed between time t5 and time t6 is used as an example for explanation, the invention is not limited thereto. For example, as shown in FIGS. 4A and 4B, the control section 10 may perform the normal refresh operation Reg_ref between time t5 and time t6. In this situation, normal refresh operations Reg_ref can be performed on a total of 12 row-addresses A~L through 3 refresh requests REF. Therefore, the refresh rate of the normal refresh operation Reg_ref can be further improved. Moreover, in other embodiments, the control section 10 may also be controlled to perform the row-hammer refresh operation RH_ref between time t5 and time t6. In this situation, the refresh rate of the normal row-hammer refresh operation RH_ref can be further improved.

In the aforementioned embodiment, although the case is explained through the control section 10 having the above described units 11 to 19, the present invention is not limited thereto. For example, the control section 10 may be composed of other circuits having the same functions as the above-mentioned embodiments and variations.

What is claimed is:

1. A semiconductor memory device, comprising:

a control section, configured to control a normal refresh operation in response to a refresh request, wherein the normal refresh operation simultaneously refreshes every memory cell connected to a plurality of word lines, and to control the execution of a row-hammer refresh operation after the normal refresh operation is performed at least once;

wherein the control section further comprises:

a first selection unit configured to select a first row address input from outside when the normal refresh operation is not performed, and select a second row address that becomes a target row address of the normal refresh operation when the normal refresh operation is performed; and a second selection unit configured to select row address selected by the first selection unit when the row-hammer refresh operation is not performed, and select a third row address that becomes a target row address of the row-hammer refresh operation when the row-hammer refresh operation is performed.

2. The semiconductor memory device as claimed in claim 1, wherein the control section is further configured to perform the row-hammer refresh operation in response to the refresh request.

3. The semiconductor memory device as claimed in claim 2, wherein the control section is further configured to perform the row-hammer refresh operation multiple times within a predetermined period, in response to the refresh request.

4. The semiconductor memory device as claimed in claim 3, wherein the control section is further configured to determine whether to perform the normal refresh operation or the row-hammer refresh operation after receiving the refresh request.

5. The semiconductor memory device as claimed in claim 2, wherein the control section is further configured to determine whether to perform the normal refresh operation or the row-hammer refresh operation after receiving the refresh request.

6. The semiconductor memory device as claimed in claim 1, wherein the control section is further configured not to perform the normal refresh operation when receiving the refresh request after the number of executions of the normal refresh operation reaches a predetermined value.

7. The semiconductor memory device as claimed in claim 1, wherein the control section is further configured not to perform the normal refresh operation when receiving the refresh request after the normal refresh operation has been performed a predetermined number of times.

8. The semiconductor memory device as claimed in claim 1, wherein the control section is further configured to perform the normal refresh operation multiple times within a predetermined period, in response to the refresh request.

9. The semiconductor memory device as claimed in claim 1, further comprising:

a counter, configured to count the number of times that the normal refresh operation is performed in response to the refresh request;

wherein the control section is further configured to perform the row-hammer refresh operation whenever the number of times counted by the counter reaches a predetermined value.

10. The semiconductor memory device as claimed in claim 1, further comprising a row decoder, configured to select the plurality of word lines that is a target of the normal refresh operation when a row address is input.

11. The semiconductor memory device as claimed in claim 1, wherein the control section further comprises a row decoder, configured to select the plurality of word lines to become targets of the normal refresh operation when the second selection unit selects the second row address.

12. A method for controlling a semiconductor memory device, comprising:

by a control section of the semiconductor memory device, controlling a normal refresh operation in response to a refresh request to simultaneously refresh memory cells connected to a plurality of word lines, controlling execution of a row-hammer refresh operation after the normal refresh operation has been performed at least once;

selecting a first row address input from outside when the normal refresh operation is not performed and selecting a second row address that becomes a target row address of the normal refresh operation when the normal refresh operation is performed, and selecting row address selected by said selecting when the row-hammer refresh operation is not performed and selecting a third row address that becomes a target row address of the row-hammer refresh operation when the row-hammer refresh operation is performed.

* * * * *